United States Patent [19]

Orvek

[11] Patent Number: 4,826,756
[45] Date of Patent: May 2, 1989

[54] LOW TEMPERATURE DEEP ULTRAVIOLET RESIST HARDENING PROCESS USING ZENON CHLORIDE LASER

[75] Inventor: Kevin J. Orvek, Plano, Tex.

[73] Assignee: Texas Instruments Incorporated, Dallas, Tex.

[21] Appl. No.: 69,333

[22] Filed: Jul. 1, 1987

[51] Int. Cl.⁴ .............................................. G03C 5/00
[52] U.S. Cl. .................................. 430/328; 430/297; 430/325; 430/311; 430/330; 430/945; 528/480; 528/502; 522/2
[58] Field of Search ............... 430/297, 328, 330, 325, 430/311, 945; 528/480, 502; 522/2

[56] References Cited

U.S. PATENT DOCUMENTS 4,596,763 6/1986 DiCarlo et al. ...................... 430/330
4,659,650 4/1987 Moritz et al. ........................ 430/330

FOREIGN PATENT DOCUMENTS 1153287 7/1986 Japan ................................... 430/328

OTHER PUBLICATIONS

Willson et al., "Ultrafast Deep Uv Lithography with Excimer Laser", 3/82, pp. 53–55.
Satohara, "Method for Preventing The Deformation of Photoresistant Fine Pattern", 7/11/86, (Translation of 61—153287).

Primary Examiner—Paul R. Michl
Assistant Examiner—Patrick A. Doody
Attorney, Agent, or Firm—Larry C. Schroeder; Leo N. Heiting; Melvin Sharp

[57] ABSTRACT

The disclosure relates to a method for low temperature (less than 120 degrees C.) hardening of photoresist pattern by providing a high power light beam consisting of light having a wavelength of about 300 nanometers and above which leads to crosslinking throughout the resist. A hot plate constant temperature (less than 120 degrees C.) is optionally used to accelerate the crosslinking reaction, thus incrasing throughput.

18 Claims, 4 Drawing Sheets

LOW TEMPERATURE DEEP ULTRAVIOLET RESIST HARDENING PROCESS USING ZENON CHLORIDE LASER

BACKGROUND AND SUMMARY OF THE INVENTION

This invention relates to photoresists for use in fabrication of semiconductor devices, and more specifically, to a low temperature process for fully hardening the photoresist.

Photoresists are used in conjunction with many different types of processing steps during semiconductor circuit manufacture. Many of these manufacturing or processing steps require that the photoresists be exposed to temperatures above 150 degrees C., usually 150 to 200 degrees C. and/or be exposed to wet chemical etches. Most photoresists cannot withstand these environments without flowing and thereby altering their shape and concomitantly changing masking dimensions, such as line widths and the like. It is therefore necessary to treat the photoresist in some manner to prevent flow thereof which causes such shape alteration.

In order to minimize this problem, photoresists of the type generally used are treated with deep ultraviolet light to crosslink and harden the photoresist. In the case of photoresists formed of phenolic resin, generally known by the name Novolak, which are the generally used photoresists, all commercial deep ultraviolet hardening processes use broadband spectral light sources. Wavelengths below about 250 nm. are strongly absorbed by the phenolic resin and penetrate about 1000 to 2000 angstroms to from a very thin shell on the surface of the resin. Such prior art systems require further heating of the resist to high temperatures, typically 180 degrees C. and higher, to crosslink the bulk of the resist below the small shell region since crosslinking achieved by use of such prior art ultraviolet processes takes place only at the small shell region near the surface. This further heating is accomplished either as a separate process or is accomplished in situ with a ramp bake.

The inability of the current systems to promote crosslinking throughout the resist without further heating is due to the limited penetration of most of the deep UV spectral range into the resist, coupled with the relatively low power output at the "optimum" wavelengths. Thus, the deep UV hardening process relies on the creation of a thin, highly crosslinked, hard shell formed by the shorter UV wavelengths, typically less than 290 nm. This shell then serves to contain the bulk of the resist as it is further heated beyond the flow point to high enough temperatures to initiate widespread thermal crosslinking in the bulk. As can be observed, the prior art system of minimizing flow of the photoresist during processing requires a hardening step as well as a subsequent heating step. It is desirable to eliminate the heating step in view of the economics obtained by saving a manufacturing step as well as by prevention of damage to the circuit which may be caused by the elevated temperature thereof. For example, for aluminum metal levels, baking the wafer near 200 degrees C. can lead to hillock growth. Also, baking an oxide level above 130 degrees C. has been found to reduce the adhesion of the resist to the oxide, leading to excessive undercut during oxide wet etch. Furthermore, wrinkling in the resist occurs during the subsequent high temperature bake or ramp bake. The wrinkling is directly correlated with the presence of the shorter wavelengths during the exposure, that is, use of the shorter, more strongly absorbed wavelengths can lead to wrinkling during the subsequent bake. The prior art has, on occasion, filtered out the spectral output below 240 nm. and reduced the spectral output from 240 nm. to 300 nm. to minimize this problem.

In accordance with the present invention, the above noted problems of the prior art are minimized and there is provided a procedure whereby the photoresist is hardened in a single step and at lower temperatures than are encountered in the prior art.

Briefly, the present invention provides for low temperature (less than 120 degrees C.) hardening of photoresist patterns whereas current commercial processes require additional high temperature baking of the resist to fully crosslink (harden) the resist. Such high temperatures (180 to 200 degrees C.) pose problems for some device process flows.

In the present invention, a laser of sufficient power (greater than 20 watts with output wavelength greater than about 300 nm. and preferably an excimer laser which provides a high power output at 308 nm is used which leads to crosslinking throughout the resist. A hotplate (constant temperature 120 degrees C.) is used to accelerate the crosslinking reaction, thus increasing throughput. The light beam from the laser is homogenized and expanded prior to impingement upon the photoresist. The light beam at wavelengths above about 300 nm. and preferably 308 nm. passes through the entire photoresist layer and causes crosslinking of all of the epoxy composing the photoresist, thereby minimizing photoresist movement during processing and providing more reliable results than in the prior art.

BRIEF DESCRIPTION OF THE DRAWINGS

The present invention will be described with reference to the accompanying drawings, wherein.

DESCRIPTION OF THE PREFERRED EMBODIMENTS

Figure 2:
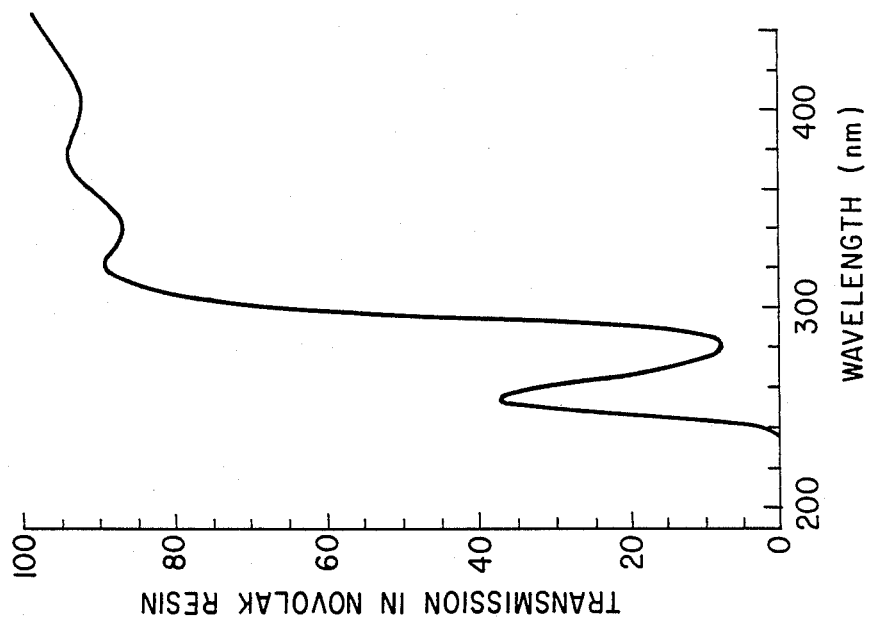
FIG. 2 is a graph showing transmission spectra of light through 0.58 micron thick Novolak resin.
Figure 1:
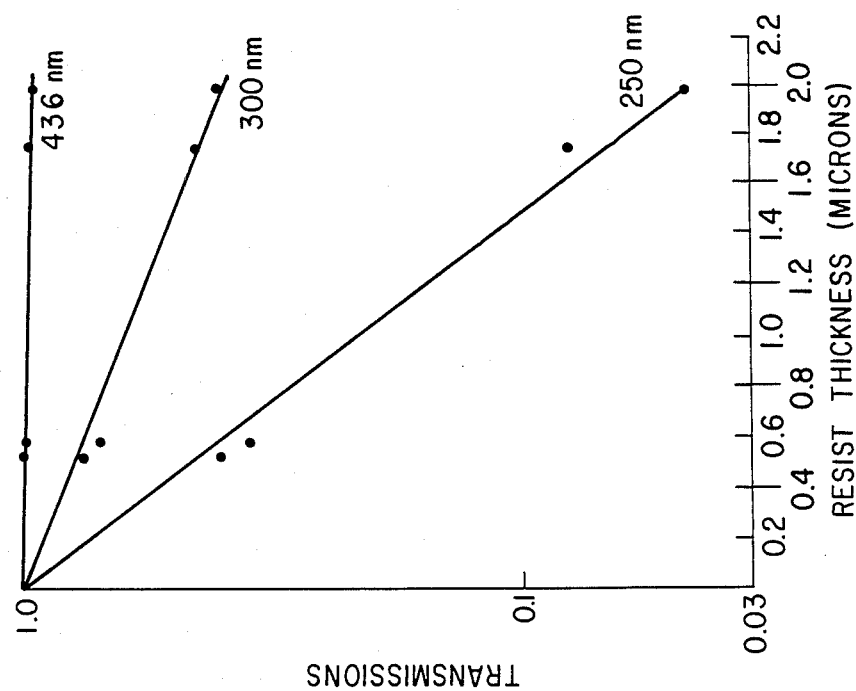
FIG. 1 is a graph showing deep ultraviolet light transmission versus Novolak resin thickness.

Referring first to the graph of FIG. 1, which relates to Novolak resins, the graph shows the transmission of various wavelengths of light as a function of resin thickness. It can be seen from this figure that the light is strongly absorbed by the resin at 250 nm., whereas transmissivity increases substantially at 300 nm and is even greater at 436 nm. As can be seen in FIG. 1, light near 250 nm. is much more strongly absorbed by the resin in resists, limiting the penetration of the light and thus the effective depth of the crosslinked shell. This increase of transmissivity with wavelength is shown to increase substantially at slightly below 300 nm. and then increase gradually thereafter from about 308 nm as shown in the graph of FIG. 2 wherein a full deep UV transmission spectrum of 0.58 micron thick Novolak resin is shown. It is apparent from FIG. 2 that light absorption is relatively large at the lower frequencies up to about 280 nm. at which point the transmissivity rapidly increases. Below about 240 nm. there is substantially total absorption of the light.

Figure 3A:
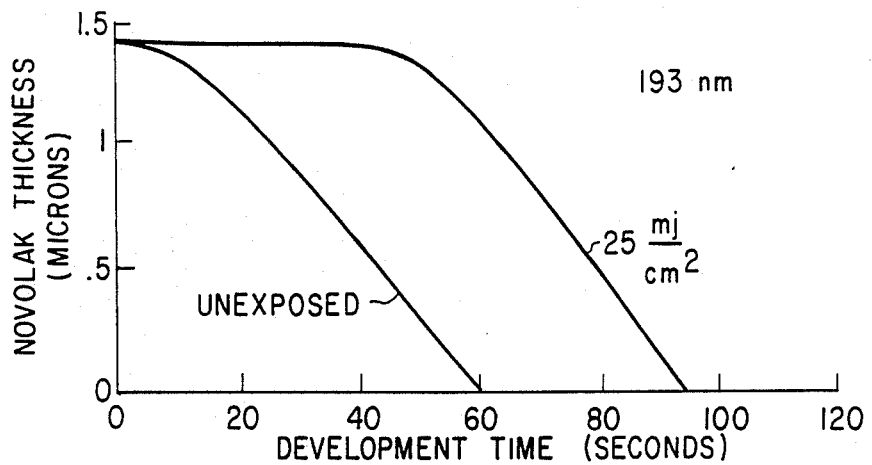
FIGS. 3A, 3B and 3C are plots of Novolak resin thickness versus development time as a function of deep ultraviolet wavelength for (A) 193 nm., (B) 248 nm. and (C) 308 nm.
Figure 3B:
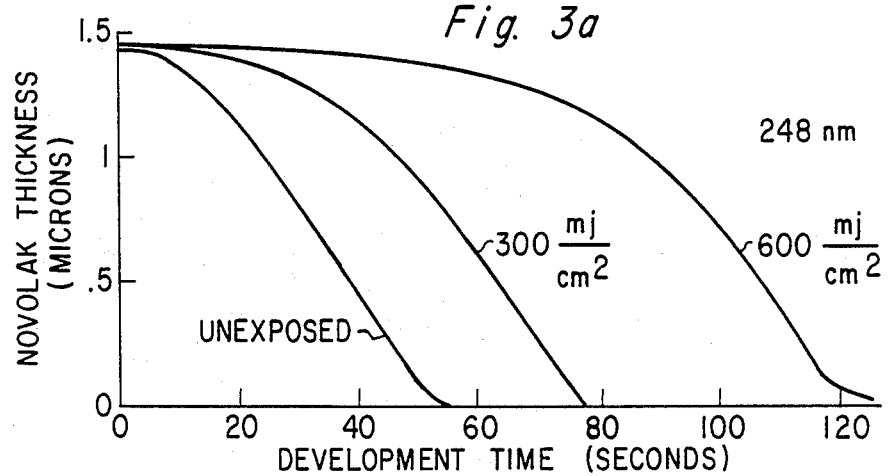
Figure 3C:
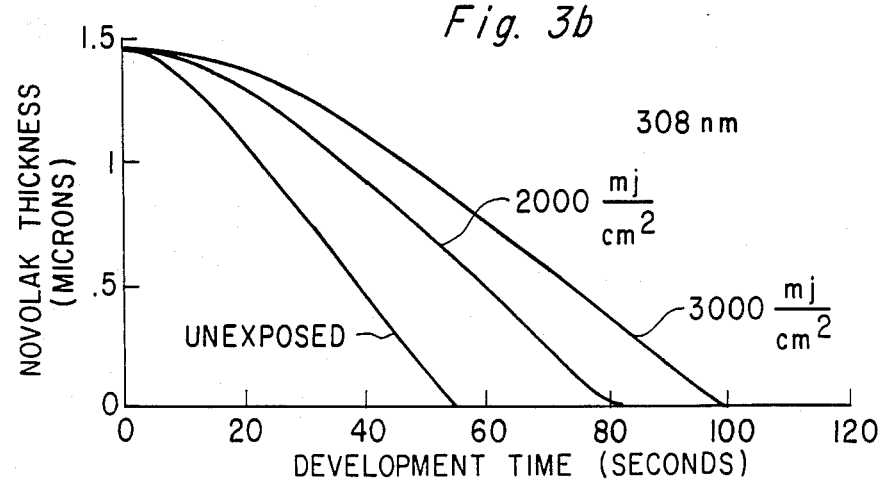

In FIGS. 3A to 3C, crosslinking is indicated by the decreased dissolution rate and thus the change in slope. The effect of the limited penetration upon crosslinking can be deduced from this figure wherein Novolak resin thickness versus development time as a function of the wavelength of the deep UV exposure is shown. FIG. 3A indicates that the 193 nm. induced crosslinking, leading to reduced development rates at the top of the resin, is confined to about the top 0.1 micron, while FIG. 3B indicates that the 248 nm. induced crosslinking extends roughly halfway into the resin, with the greater amount of crosslinking within the top 0.5 micron. By comparison, light at 308 nm. promotes crosslinking throughout the resin, as indicated in FIG. 3C, such that the development rate never increases to the unexposed rate. Light near 300 nm. thus promotes crosslinking throughout the resist rather than just near the top of the resist.

Figure 4A:
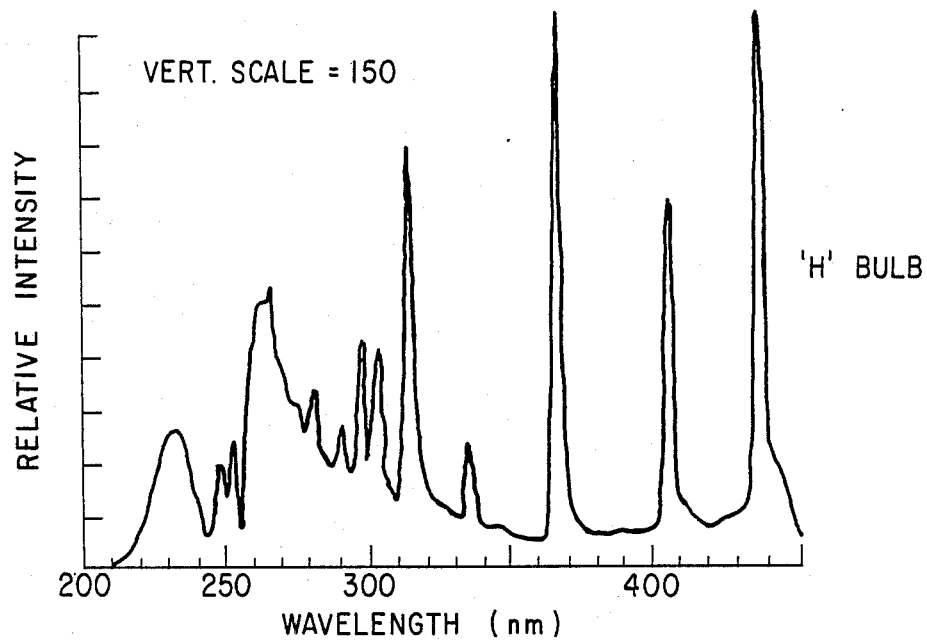
FIGS. 4A and 4B are graphs showing spectral outputs of two lamps available for use on the Fusion Semiconductor Systems 150PC which is a commercial state of the art deep UV hardening system.
Figure 4B:
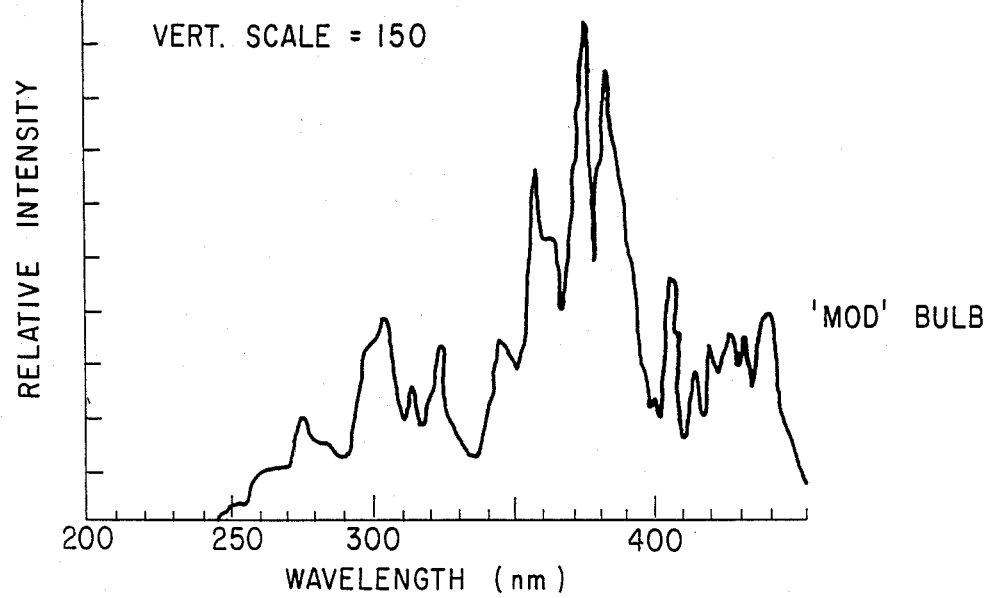

The lamp spectral curves shown in FIGS. 4A and 4B show the conventional "H" bulb in (A) and a filtered "MD" bulb in (B). It can be seen that substantially all light is eliminated below about 240 nm. from the MD bulb with a lowered light intensity being provided from about 240 to about 300 nm.

Figure 5:
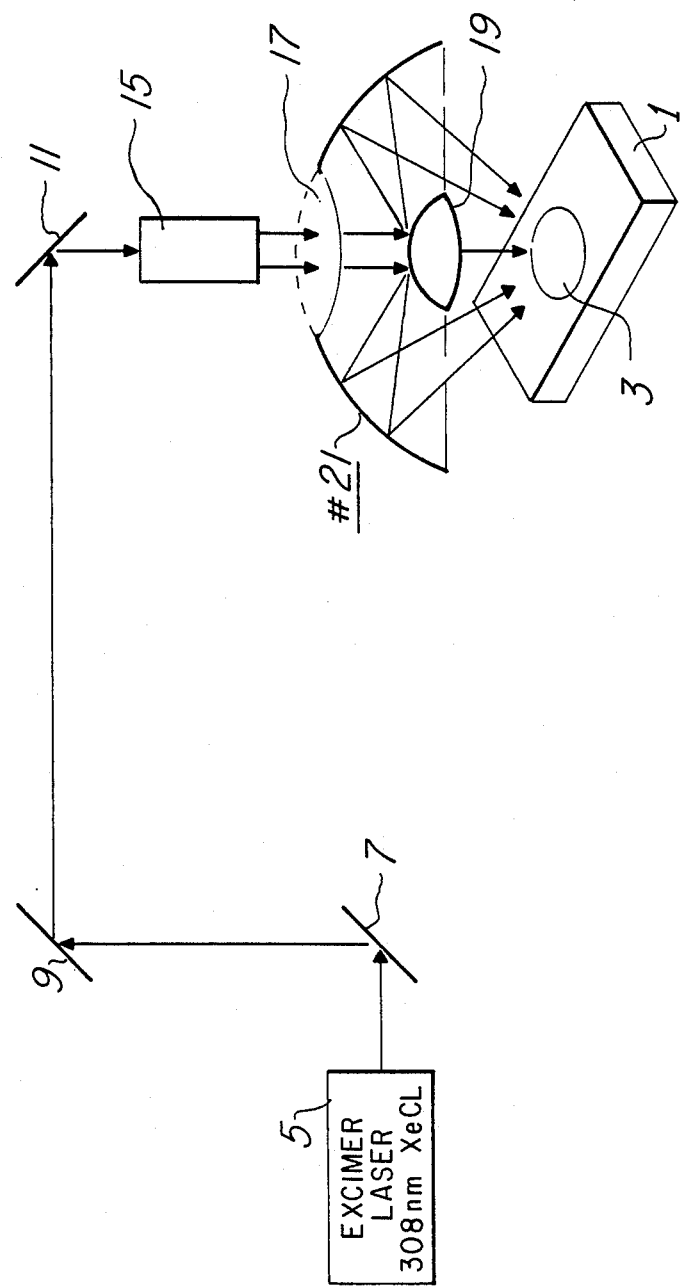
FIG. 5 is a schematic diagram of a system in accordance with the present invention for hardening of photoresist.

Referring to FIG. 5, there is shown a system in accordance with the present invention for exposing and hardening photoresist. The system includes a hotplate 1 having a semiconductor slice 3 thereon. The hotplate 1 is designed to heat the slice and any photoresist thereon to a temperature of up to about 120 degrees C. to increase the rate of crosslinking during exposure to the appropriate light frequencies by a substantial factor. It should be understood that the hotplate 1 can be eliminated or the temperature thereof reduced with concomitant reduction in the speed of crosslinking.

An excimer laser (XeCl gas) 5 which provides a high power output at 308 nm. transmits a light beam to a first mirror 7 which reflects the beam at a ninety degree angle to a second mirror 9 which again reflects the beam at a ninety degree angle and parallel to the direction of the output beam from the laser 5. This beam is then reflected by a third mirror 11 at a ninety degree angle which is parallel to the direction of the first reflected beam and opposite thereto. This beam passes through a beam homogenizer and beam expander 15, which devices are well known to provide a light beam of predetermined cross section. A hollow quartz tube which reflects light rays therein can be used to perform such a function. The homogenized and expanded beam passes through an entrance hole 17 in the processing chamber (not shown) wherein the hotplate 1 and semiconductor slice 3 are disposed. When the beam enters the processing chamber, it is reflected from a mirror 19 to a secondary mirror 21 and then onto the semiconductor slice having photoresist thereon. The mirror 19 can be partially transmitting and permit a portion of the light beam impinging thereon to pass directly therethrough to expose the tops of the resist patterns while reflections to the secondary mirror and thus down to the slice would come in at an angle to equally expose the sides of the resist. This angled exposure is not as important as with conventional mercury bulb systems. Thus, the system may not even require the parabolic mirror assembly, but just use a direct exposure, including the use of a scanning beam system.

The invention allows complete crosslinking of resist to be accomplished at low temperatures (less than 120 degrees C.) Another significant advantage of the present invention is that the exposure need not be carried out uniformly on the sides as well as the top of the resist. With the conventional mercury sources, the limited penetration of the light required that all sides of the resist be uniformly exposed to create the shell, otherwise the resist would bulge out in any weak areas upon further heating. With the full penetration available in the current invention, that is no longer necessary. The use of the excimer laser also provides for a greater power output near 300 nm. than would be available with use of a highly filtered mercury lamp source. For example, present day excimer lasers provide a power output near 100 watts at 308 nm. The Fusion Semiconductor System 150PC operating with the MOD bulb indicated in FIG. 4 has a 45 watt power output between 300 nm. and 310 nm., however this bulb still has a significant output near 280 nm. From the transmission curve in FIG. 2, it can be seen that light near 280 nm. is actually absorbed more strongly than light near 250 nm. and thus the induced crosslinking depth from the 280 nm. component should only be about 0.3 micron, estimated from the data in FIG. 3. To significantly reduce the 280 nm. output from the MOD bulb would require use of filters which would also lead to reduction in the 300 nm. output. It should also be noted that the excimer laser mentioned herein is designed for multi-gas use and that a laser optimized for XeCl would have increased power output.

Since deep UV exposure and baking is currently used in other areas for polymer curing (paints, coatings), this invention may be applicable to those industrial processes as well.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

TECHNICAL ADVANTAGES

The described embodiments of the present invention provide a method for hardening phenolic resin using ultraviolet radiation. The method provides hardening throughout the resin layer while avoiding high temperature curing of the resin. the ability to harden the resin throughout allow for a simpler ultraviolet light mechanism. Avoiding high temperature prevents problems associated with high temperature processing such as "hillocking" of aluminum layers.

What is claimed is:

1. A method of hardening a phenolic resin, comprising the steps of:
   (a) providing a patterned layer comprising phenolic resin;
   (b) directing a substantially coherent light beam consisting essentially of light having a wavelength greater than about 300 nanometers and less than 320 nanometers through said resin to crosslink all of said resin; while (c) heating said layer to a temperature above ambient temperature and less than about 120 degrees Centigrade.

2. The method of claim 1 wherein said light beam is provided by a laser and has a wavelength of substantially 308 nanometers.

3. The method of claim 1 wherein said resin is disposed on a semiconductor substrate.

4. The method of claim 2 wherein said resin is disposed on a semiconductor substrate.

5. The method of claim 1 wherein said resin is disposed on a semiconductor substrate.

6. The method of claim 2 wherein said resin is disposed on a semiconductor substrate.

7. The method of claim 3 wherein said resin is in a photoresist.

8. The method of claim 4 wherein said resin is in a photoresist.

9. The method of claim 5 wherein said resin is in a photoresist.

10. The method of claim 6 wherein said resin is in a photoresist.

11. The method of claim 7 wherein step (b) includes providing a mirror system to direct said light beam onto said resin.

12. The method of claim 8 wherein step (b) includes providing a mirror system to direct said light beam onto said resin.

13. The method of claim 9 wherein step (b) includes providing a mirro system to direct said light beam onto said resin.

14. The method of claim 10 wherein step (b) includes providing a mirro system to direct said light beam onto said resin.

15. The method of claim 11 wherein said mirror system includes a beam homogenizer and beam expander.

16. The method of claim 12 wherein said mirro system includes a beam homogenizer and beam expander.

17. The method of claim 13 wherein said mirro system includes a beam homogenizer and beam expander.

18. The method of claim 14 wherein said mirro system includes a beam homogenizer and beam expander.

* * * * *